United States Patent [19]
Go

[11] Patent Number: 5,304,818
[45] Date of Patent: Apr. 19, 1994

[54] LEAD FRAME

[75] Inventor: Hisao Go, Kanagawa, Japan

[73] Assignee: Sumitomo Electric Industries, Ltd., Osaka, Japan

[21] Appl. No.: 917,747

[22] Filed: Jul. 24, 1992

Related U.S. Application Data

[63] Continuation of Ser. No. 670,421, Mar. 18, 1991, abandoned.

[30] Foreign Application Priority Data

Mar. 16, 1990 [JP] Japan ................. 2-66179

[51] Int. Cl.$^5$ ............................................ H01L 23/48
[52] U.S. Cl. .................................. 257/81; 257/433; 257/669; 257/725
[58] Field of Search ................... 357/70, 72, 75, 81, 357/74, 68; 257/81, 433, 448, 666, 669, 676, 723, 725

[56] References Cited

U.S. PATENT DOCUMENTS

| | | | |
|---|---|---|---|
| 4,136,357 | 1/1979 | Frederiksen | 257/434 |
| 4,188,708 | 2/1980 | Frederiksen | 437/3 |
| 4,730,198 | 3/1988 | Brown et al. | 385/89 |
| 4,744,626 | 5/1988 | Mery | 250/227.24 |
| 4,803,361 | 2/1989 | Aiki et al. | 250/227.24 |
| 4,820,013 | 4/1989 | Fuse | 257/88 |
| 4,827,118 | 5/1989 | Shibata et al. | 257/432 |
| 4,834,491 | 5/1989 | Aoki et al. | 257/81 |
| 4,868,640 | 9/1991 | Shiné | 357/70 |
| 4,937,654 | 6/1990 | Hirabayashi | 257/668 |
| 4,961,107 | 10/1990 | Geist et al. | 357/75 |
| 4,977,442 | 12/1990 | Suzuki et al. | 357/70 |

FOREIGN PATENT DOCUMENTS

| | | |
|---|---|---|
| 0183857 | 6/1986 | European Pat. Off. . |
| 0273364 | 7/1988 | European Pat. Off. . |
| 58-4952 | 1/1983 | Japan . |
| 59-119774 | 7/1984 | Japan . |
| 59-205775 | 11/1984 | Japan . |
| 60-017411 | 1/1985 | Japan . |
| 62-169334 | 7/1987 | Japan . |
| 63-015454 | 1/1988 | Japan . |
| 2-119187 | 5/1990 | Japan . |
| 88/10441 | 12/1988 | PCT Int'l Appl. . |
| 90/00753 | 1/1990 | PCT Int'l Appl. . |
| 90/04799 | 5/1990 | PCT Int'l Appl. . |
| 630760 | 6/1982 | Switzerland . |
| 2126795 | 3/1984 | United Kingdom . |

Primary Examiner—Rolf Hille
Assistant Examiner—Roy Potter
Attorney, Agent, or Firm—Cushman, Darby & Cushman

[57] ABSTRACT

A lead frame, used for constructing a multi-core optical module or the like, includes a frame portion, a plurality of substrate portions on which electronic circuit elements are to be mounted, and a support portion for securing the plurality of substrate portions to the frame portion. The support portion has a plurality of separated end portions connected to the respective substrate portions at the position where a molded resin member is covered, and at least two of the plurality of end portions are combined into one body to be connected to the frame portion at the point where the molded resin member is not covered.

3 Claims, 7 Drawing Sheets

LEAD FRAME

This is a continuation of application Ser. No. 07/670,421, filed on Mar. 18, 1991, which was abandoned upon the filing hereof.

BACKGROUND OF THE INVENTION

This application is directed to the subject matter than is generally related to the subject matter disclosed in the following U.S. applications: U.S. Ser. No. 07/588,990, filed Sep. 27, 1990; U.S. Ser. No. 07/667,301, filed Mar. 12, 1991; and U.S. Ser. No. 07/573,583, filed Aug. 28, 1990.

The present invention relates to a lead frame used, for example, as a component for producing a multi-core optical module.

A multi-core optical module, in which a plurality of optical operation elements (laser-diodes, photo diodes, etc.) are linked to a number of optical fibers, is used for building an optical communication system such as an optical local area network (LAN).

To produce such a multi-core optical module, electronic circuit elements are mounted on a substrate portion $1a$ of a lead frame (FIG. 1 or 2) and wires carrying optical connectors fixing optical operation elements are connected to the substrate portion. Subsequently, the lead frame is attached to a die mold, after which the multi-core optical module is produced by filling the die mold with resin.

However, when the optical operation elements including optical transmission circuits and optical receiving circuits are mounted on the single substrate portion $1a$ of the conventional lead frame 1 as shown in FIG. 1, signals of the optical transmission circuits may flow into the optical receiving circuits (cross talk) since they have a common ground, hence, erroneous operations are apt to occur. Furthermore, the substrate portion $1a$ has an unnecessarily large surface area, so that any thermal stress during, as well as after, the molding process may cause deterioration due to any cracks generated in a formed resin portion.

On the other hand, when the substrate portion $1a$ is divided into two parts in the conventional lead frame 1 as in FIG. 2, each being supported by three portions to electrically insulate the circuits, the substrate portion $1a$ is unstable before the molding step, so that wires connecting the optical operation element to the substrate portion $1a$ are apt to be damaged due to any resulting movement. Furthermore, the substrate portion $1a$ is apt to vibrate due to an ultrasonic frequency applied at the wire bonding, thus it is difficult to assure a sufficient strength of wire bonding.

SUMMARY OF THE INVENTION

Therefore, an objective of the present invention is to provide a lead frame in which a plurality of substrate portions are sufficiently secured and are sufficiently insulated from each other in a final product thereby eliminating the above-mentioned problems.

This objective is accomplished by providing a lead frame including a frame portion, a plurality of substrate portions on which electronic circuit elements are mounted, and a support portion for securing the plurality of substrate portions to the frame portion. The support portion has a plurality of separated end portions connected to the respective substrate portions at the point where a molded resin member is covered, and at least two of the plurality of end portions are configurated into one body to be connected to the frame portion at the point where the molded resin member is not covered.

According to the present invention, since the respective substrate portions are connected to the support portion, the substrate portions are sufficiently secured to the frame portion. Furthermore, since the support portion is connected to the separated end portions at the point where the molded resin member is covered, the plurality of substrate portions are well insulated from each other after trimming the end portions of the protruding end portions upon completion of resin molding.

DETAILED DESCRIPTION OF THE INVENTION

Preferred embodiments of the present invention will be described with reference to the accompanying drawings.

Figure 1:
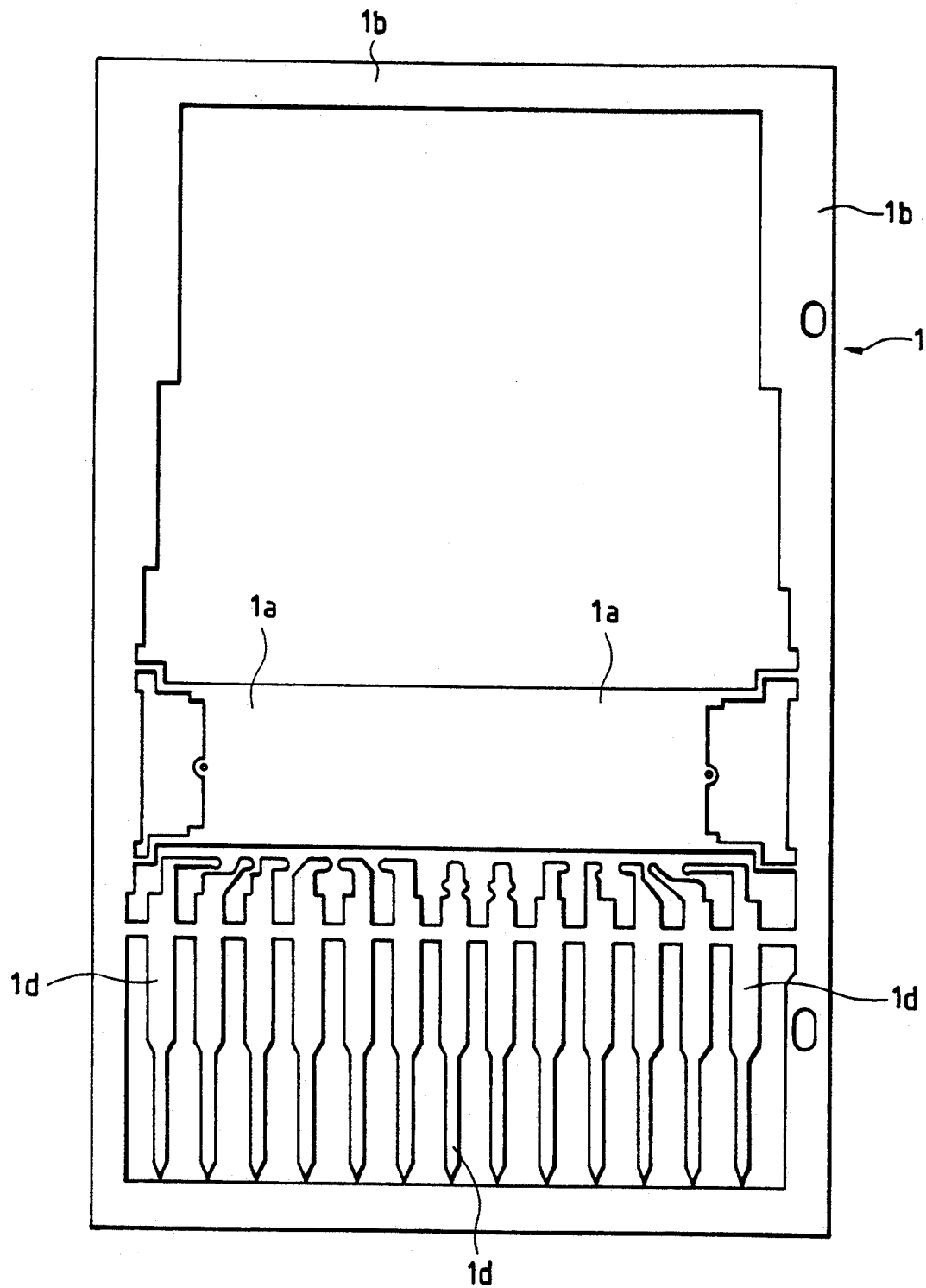
FIGS. 1 and 2 illustrate lead frames of prior art.
Figure 2:
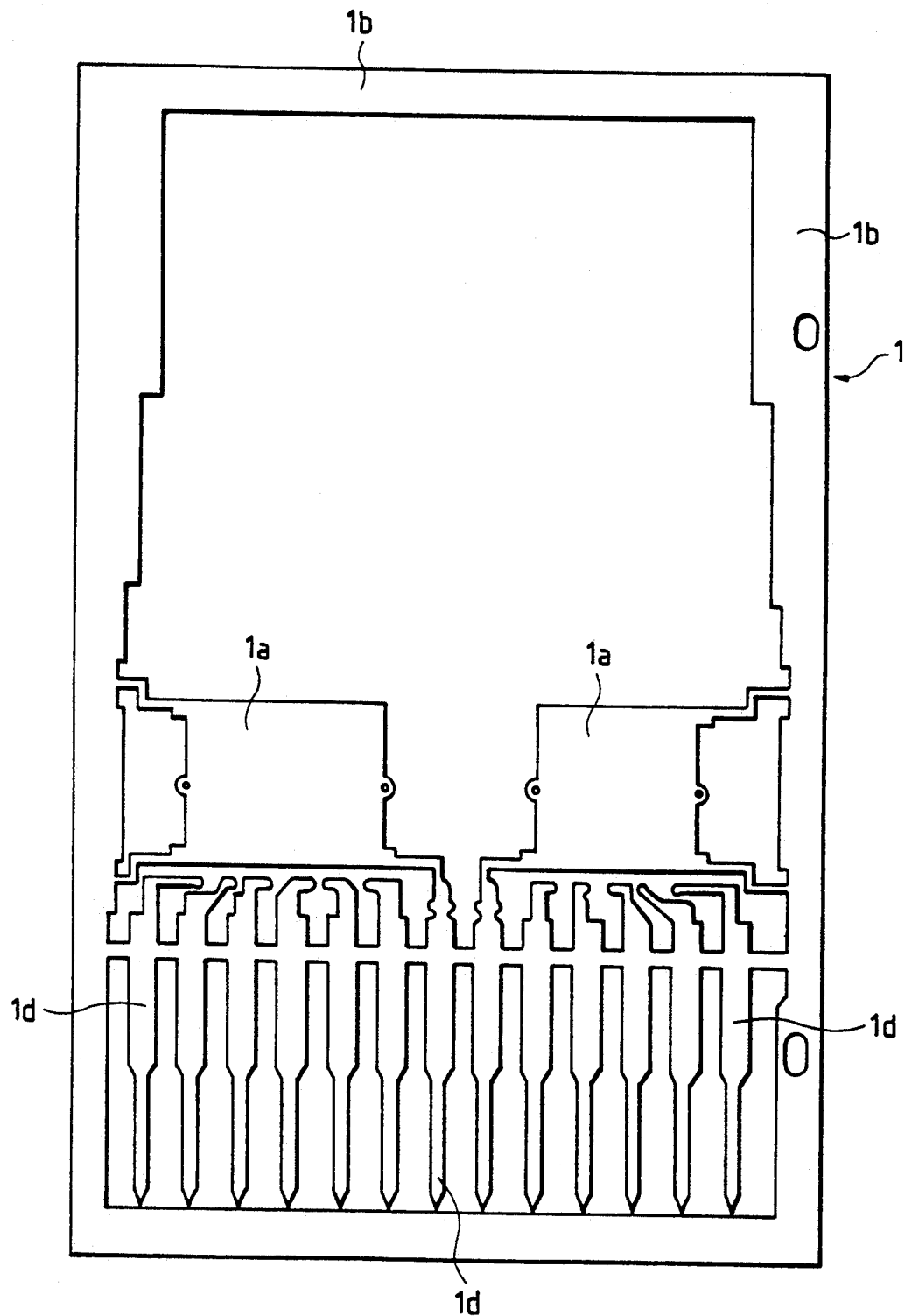
Figure 3:
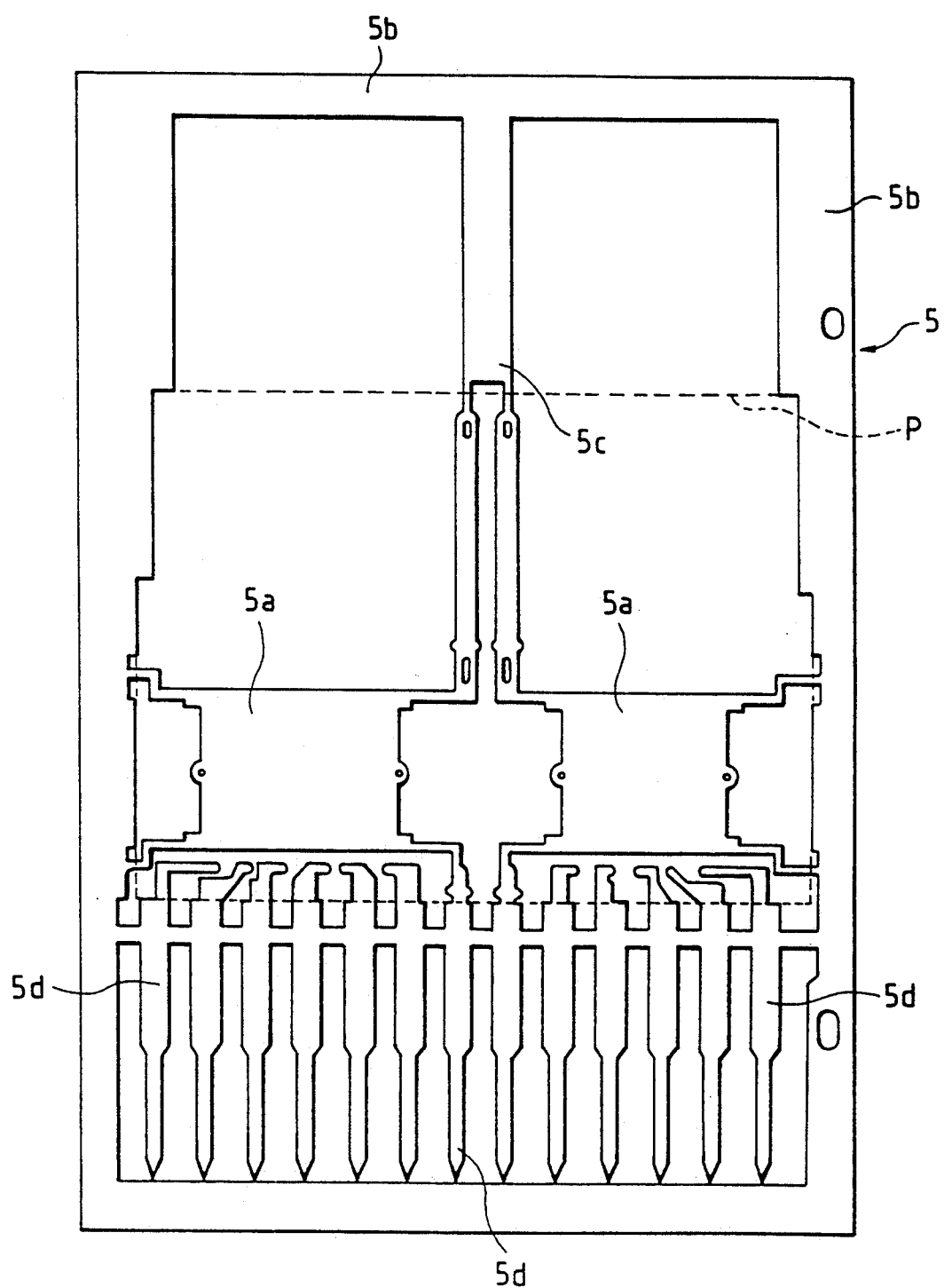
FIG. 3 shows the first embodiment of a lead frame according to the present invention.

FIG. 3 shows a lead frame according to a first embodiment of the present invention. In FIG. 3, a lead frame 5 includes a support portion $5c$ disposed between a frame portion $5b$ and substrate portions $5a$, and lead pins $5d$. The lead frame is attached to a mold die at resin molding, and a resin is filled into a cavity of the mold die so that a package portion is formed. A dotted line in the figure schematically shows the package portion P formed integrally by the resin molding. The support portion $5c$ has two separated end portions inside the resin package portion P so as to secure the respective substrate portions $5a$ and the lead pins $5d$ to the frame portion $5b$. The separated end portions are configurated into one body outside the package portion P, and the one body is then connected to the frame portion $5b$. Accordingly, the substrate portions $5a$ are sufficiently secured to the frame portion $5b$ and the substrate portions are well insulated from one another by trimming the separated end portions after the resin molding.

When the above lead frame is used to form a multi-core optical module, electronic circuit elements are mounted on the substrate portions $5a$ and are connected to the lead pins $5d$ and to optical operation elements fixed to optical connectors. Then the lead frame is subjected to the resin molding to form the multi-core optical module.

Figure 4:
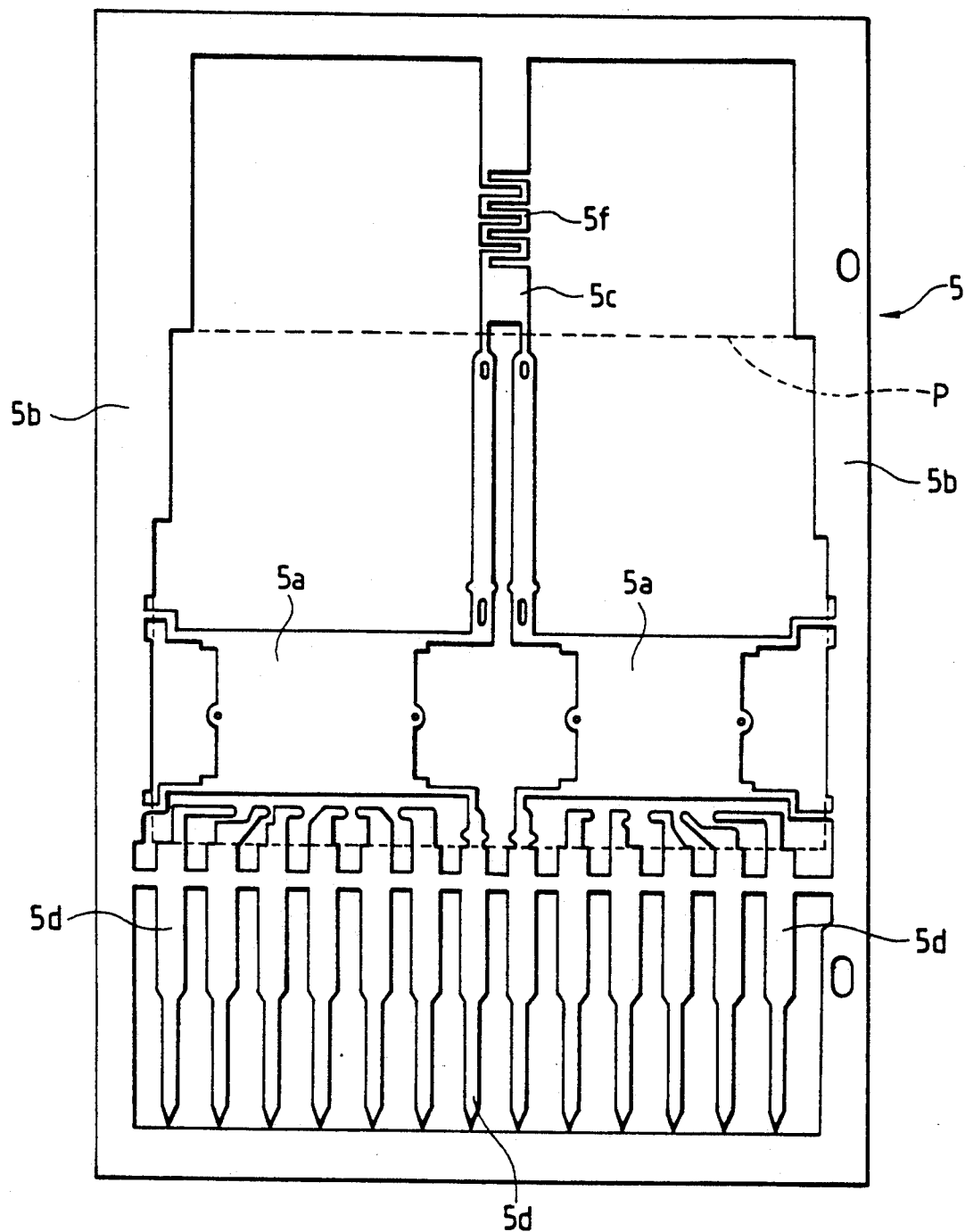
FIGS. 4 to 7 show lead frames according to the second, third, fourth and fifth embodiments of the present invention, respectively.

FIG. 4 shows a second embodiment of the present invention. The second embodiment is equivalent to the first embodiment except that the support portion $5c$ has a stress absorbing portion $5f$ which is a thin zigzag portion provided in the support portion $5c$.

The stress absorbing portion $5f$ will readily deform under applied stress. Thus, even if the support portion $5c$ becomes shorter due to the contraction of resin after resin molding, the stress absorbing portion $5f$ will stretch to compensate, thereby relieving the frame portion $5b$ of any undesired stress. Since the frame portion $5b$ is no longer subjected to stress, the lead pins $5d$ are no longer forced out of the formed resin. There is no clearance at the interface between the lead pins $5d$ and the formed resin portion, and consequently, humidity resistance and connecting strength of the lead pins 5d are not diminished. Because no substantial stress is applied to the inner portion of the lead pins, wires bonded to the lead pin 5d are safe from breaking. Furthermore, when unnecessary portions of the lead frame in a final product are trimmed off by a stamping die, the portions are trimmed accurately, because there is no deformation of the frame portion caused by the undesired stress.

Figure 5:
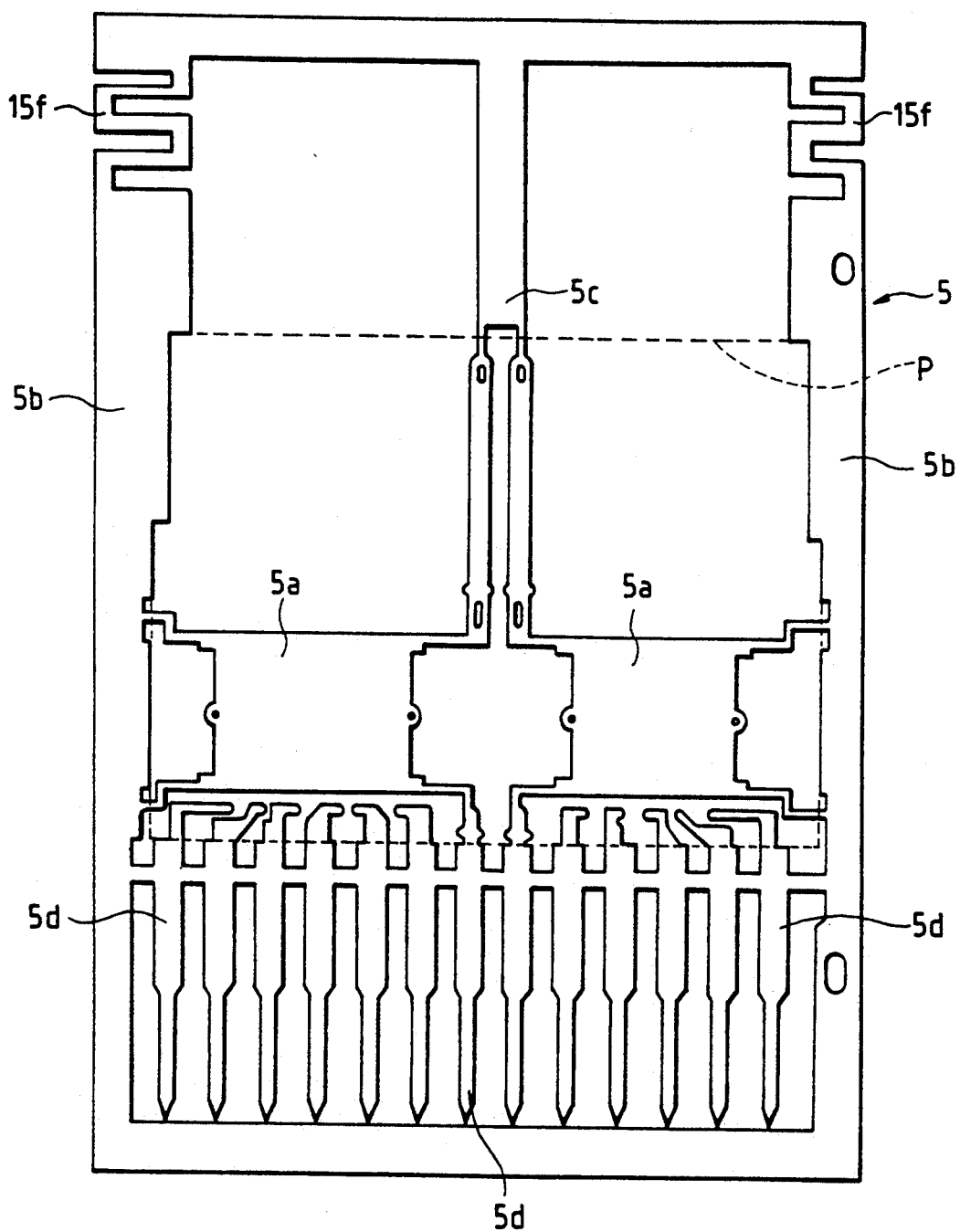

FIG. 5 shows a third embodiment of the present, invention. This embodiment is equivalent to the second embodiment except that stress absorbing portions 15f are disposed on a frame portion 5b. In this embodiment, when the support portion 5c becomes shorter due to the contraction of resin after resin molding, the stress absorbing portions 15f will contract to compensate, releiving the frame portion 5b from undesired stress.

Figure 6:
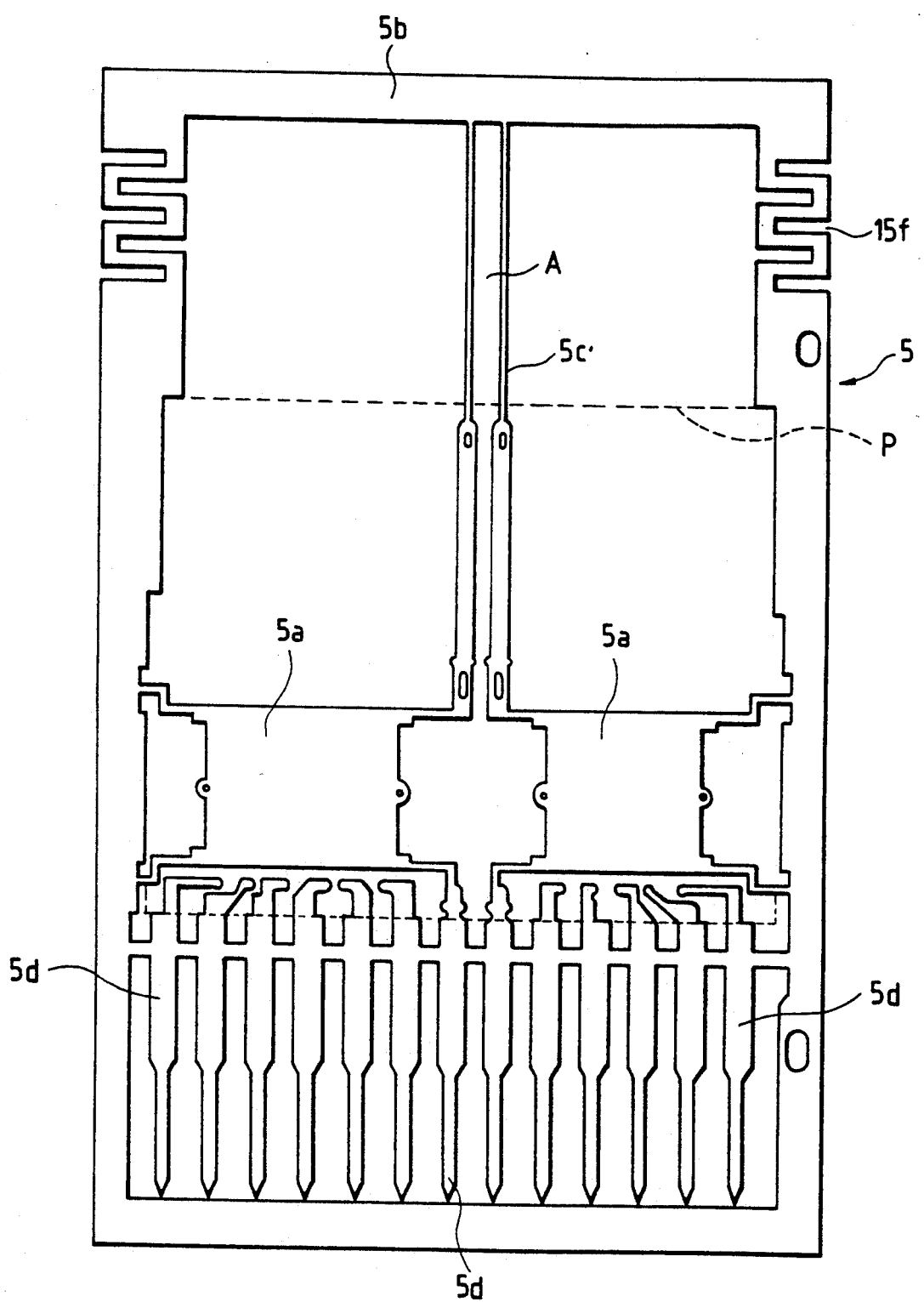

FIG. 6 shows a lead frame according to the fourth embodiment of the present invention. This embodiment is equivalent to the third embodiment shown in FIG. 5 except that the separated support portion is configurated into one body at the frame portion. This embodiment has also the same effects as those in the second embodiment. In this case, a resin may enter into portion A between the separated support portions at the molding step, so that burrs are formed. However, these burrs can be subsequently removed.

Figure 7:
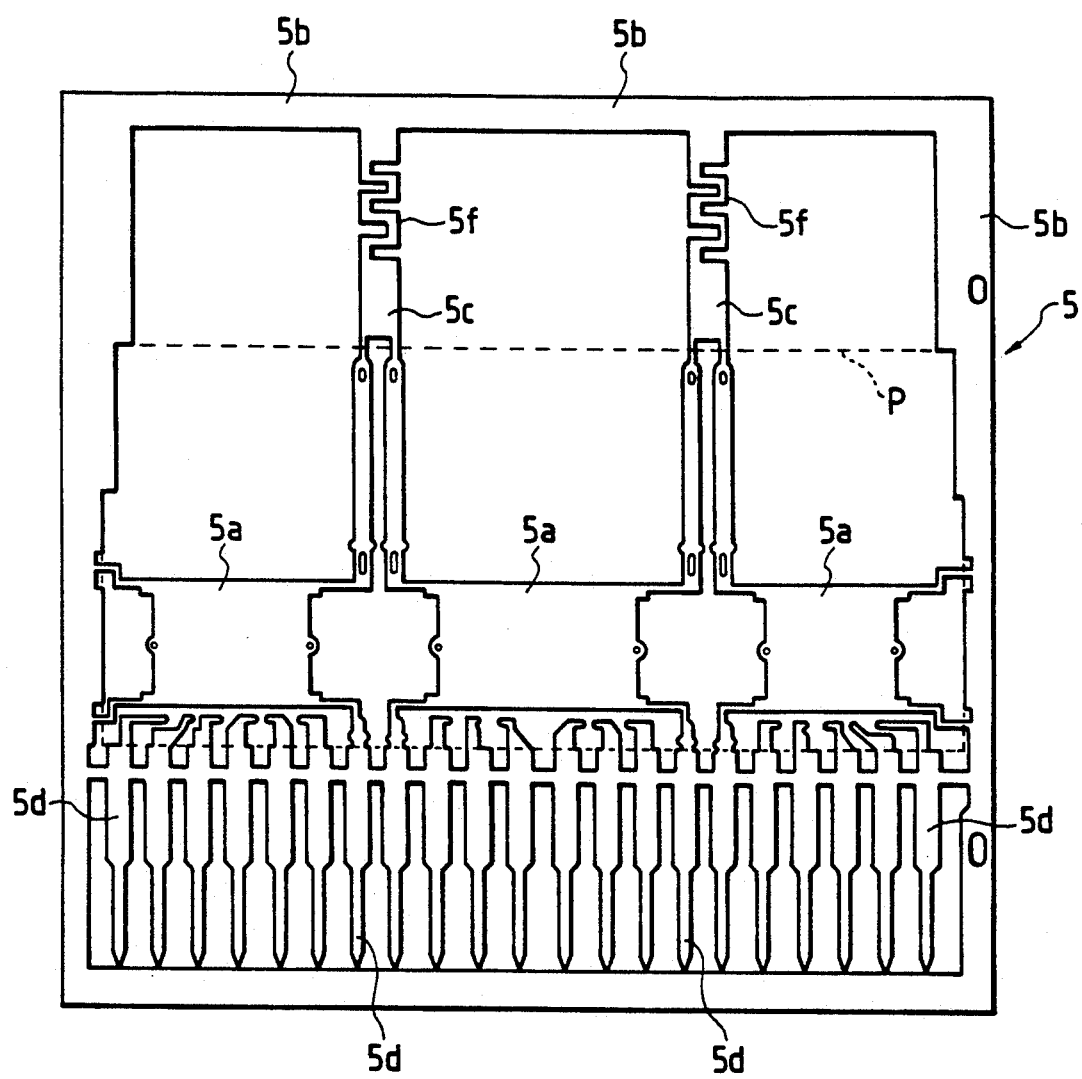

FIG. 7 shows a lead frame according to the fifth embodiment of the present invention. This embodiment is equivalent to the second embodiment shown in FIG. 4 except that three substrate portions 5a and two support portions 5c are provided. This embodiment also has the same effects as those in the former embodiments. That is, the present invention is also applicable to a multi-core optical module having more than three cores.

It will be readily apparent to those skilled in the art that other embodiments of the present invention may be implemented without departing from the scope of inventive concept expressed by the following claims.

What is claimed is:

1. A lead frame used as a component in a multi-core module having optical connectors and electronic circuit elements, said lead frame comprising:
   a frame portion;
   a plurality of substrate portions on which said electronic circuit elements are to be mounted; and
   at least one support portion disposed between said optical connectors for securing said plurality of substrate portions to said frame portion, said support portion having a plurality of separated end portions connected to said respective substrate portions in a manner that secures said substrate portions in place, at least two of said separated end portions combining into one body, said one body being directly connected to said frame portion, and said support portion for sufficiently insulating said plurality of substrate portions from one another upon trimming said separated end portions after molding of said lead frame,
   wherein said lead frame is an integral component for producing said multi-core optical module, in which said lead frame, optical connectors and optical operation elements are integrally molded into one body with a mold resin material.

2. A lead frame as claimed in claim 1, wherein said support portion includes a stress absorbing portion for preventing deformation of said lead frame during a molding process of said lead frame.

3. A lead frame as claimed in claim 1, wherein said frame portion includes at least one stress absorbing portion for preventing deformation of said lead frame during a molding process of said lead frame.

* * * * *